United States Patent
Horak et al.

(10) Patent No.: US 9,141,749 B2
(45) Date of Patent: Sep. 22, 2015

(54) INTERCONNECT STRUCTURES AND METHODS FOR BACK END OF THE LINE INTEGRATION

(71) Applicant: INTERNATIONAL BUSINESS MACHINES CORPORATION, Armonk, NY (US)

(72) Inventors: David V. Horak, Essex Junction, VT (US); Charles W. Koburger, III, Delmar, NY (US); Shom Ponoth, Gaithersburg, MD (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/069,855

(22) Filed: Nov. 1, 2013

(65) Prior Publication Data

US 2014/0068541 A1     Mar. 6, 2014

Related U.S. Application Data

(63) Continuation of application No. 13/164,940, filed on Jun. 21, 2011, now Pat. No. 8,637,400.

(51) Int. Cl.
    *G06F 17/50*     (2006.01)
    *H01L 21/768*    (2006.01)

(52) U.S. Cl.
    CPC ...... *G06F 17/5077* (2013.01); *H01L 21/76834* (2013.01); *H01L 21/76885* (2013.01)

(58) Field of Classification Search
    None
    See application file for complete search history.

(56) References Cited

U.S. PATENT DOCUMENTS

| | | |
|---|---|---|
| 5,512,514 A | 4/1996 | Lee |
| 5,693,568 A | 12/1997 | Liu et al. |
| 5,915,203 A | 6/1999 | Sengupta et al. |
| 6,051,882 A | 4/2000 | Avanzino et al. |
| 6,271,135 B1 | 8/2001 | Palmans et al. |
| 6,355,555 B1 | 3/2002 | Park |
| 6,413,852 B1 | 7/2002 | Grill et al. |
| 6,452,110 B1 | 9/2002 | Clevenger et al. |
| 6,673,524 B2 | 1/2004 | Ghandehari et al. |
| 6,780,753 B2 | 8/2004 | Latchford et al. |
| 7,186,639 B2 | 3/2007 | Lee |
| 7,312,146 B2 | 12/2007 | Cheung et al. |
| 7,422,983 B2 | 9/2008 | Cotte et al. |
| 7,450,295 B2 | 11/2008 | Tung et al. |
| 7,612,453 B2 | 11/2009 | Usami |
| 7,984,409 B2 * | 7/2011 | Hsu et al. ............ 716/119 |
| 8,637,400 B2 * | 1/2014 | Horak et al. ......... 438/674 |
| 2003/0116439 A1 | 6/2003 | Seo et al. |
| 2009/0275179 A1 | 11/2009 | Basker et al. |
| 2009/0309226 A1 | 12/2009 | Horak et al. |
| 2010/0176512 A1 | 7/2010 | Yang et al. |
| 2011/0031623 A1 | 2/2011 | Yang et al. |
| 2011/0062587 A1 | 3/2011 | Yang et al. |

* cited by examiner

*Primary Examiner* — Scott B Geyer
(74) *Attorney, Agent, or Firm* — Catherine Ivers; Roberts Mlotkowski Safran & Cole, P.C.

(57) ABSTRACT

A method of forming a semiconductor structure includes forming a sacrificial conductive material layer. The method also includes forming a trench in the sacrificial conductive material layer. The method further includes forming a conductive feature in the trench. The method additionally includes removing the sacrificial conductive material layer selective to the conductive feature. The method also includes forming an insulating layer around the conductive feature to embed the conductive feature in the insulating layer.

20 Claims, 6 Drawing Sheets

INTERCONNECT STRUCTURES AND METHODS FOR BACK END OF THE LINE INTEGRATION

FIELD OF THE INVENTION

The invention relates to semiconductor structures and methods of manufacture and, more particularly, to interconnect structures and methods for back end of the line (BEOL) integration.

BACKGROUND

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device involves formation of multilevel or multilayered schemes, such as, for example, single or dual damascene wiring structures. The wiring structure typically includes copper (Cu), since Cu based interconnects provide higher speed signal transmission between large numbers of transistors on a complex semiconductor chip as compared with aluminum, e.g., Al-based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in integrated circuit (IC) product chips by embedding the metal lines and metal vias (e.g., conductive features) in a dielectric material having a dielectric constant of less than silicon dioxide.

The damascene processes used in forming interconnect and via structures face challenges as the size of devices and associated interconnects shrinks. In typical formation of an interconnect or via, a seed layer is formed on surfaces of a trench prior to forming the conductive material, e.g., copper, etc., in the trench. However, sufficient seed layer coverage on the patterned dielectric is difficult to achieve with ultra thin seed layers, e.g., seed layers having a thickness less than 2 nm. Moreover, void-free plating is becoming difficult due to poor liner and/or seed coverage, and also due to high aspect ratio (AR) challenges for plating. For example, interconnects and/or vias formed in high AR trenches may detrimentally experience pinch-offs, voids, etc., if the liner is too thick at the top of the trench or via hole.

Accordingly, there exists a need in the art to overcome the deficiencies and limitations described hereinabove.

SUMMARY

In a first aspect of the invention, a method of forming a semiconductor structure includes forming a sacrificial conductive material layer. The method also includes forming a trench in the sacrificial conductive material layer. The method further includes forming a conductive feature in the trench. The method additionally includes removing the sacrificial conductive material layer selective to the conductive feature. The method also includes forming an insulating layer around the conductive feature to embed the conductive feature in the insulating layer.

In another aspect of the invention a method of forming a semiconductor structure includes forming a first conductive material layer on one of a lower interconnect level and a substrate. The method further includes forming first trenches in the first conductive material layer. The method also includes filling the first trenches with a first conductor to form first conductive features. The method additionally includes forming a second conductive material layer on the first conductive material layer. The method further includes forming second trenches in the second conductive material layer. The method also includes filling the second trenches with a second conductor to form second conductive features. The method additionally includes removing the first and second conductive material layers leaving the first and second conductive features. The method further includes forming an insulating layer around the first and second conductive features such that the first and second conductive features are embedded in the insulating layer.

In yet another aspect of the invention, a semiconductor structure includes an electroplated conductive feature embedded in an insulating layer. The structure is devoid of a seed layer between the electroplated conductive feature and the insulating layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an interconnect structure which comprises the structures of the present invention. In still further embodiments, a method in a computer-aided design system is provided for generating a functional design model of the interconnect structure. The method comprises generating a functional representation of the structural elements of the interconnect structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to interconnect structures and methods for back end of the line (BEOL) integration. In accordance with aspects of the invention, an integration scheme includes forming a sacrificial conductive mandrel layer without the use of a seed layer. In embodiments, a manufacturing sequence proceeds by patterning and etching of trenches (e.g., via holes, line/wire/interconnect troughs, etc.) in the sacrificial conductive mandrel layer with or without a capping insulator, and electroplating of via/interconnect material onto and into the sacrificial conductive mandrel layer. The sequence further includes planarizing (e.g., polishing or etching) the plated material to the top of the sacrificial conductive mandrel layer, and selectively removing the sacrificial conductive mandrel layer. The sequence continues with the formation of a dielectric material around the via/interconnect material. Advantageously, the sacrificial conductive mandrel layer eliminates the need for a separate seed layer, which alleviates problems associated with poor seed layer coverage, seed layer pinch-off of high AR trenches, seed layer-induced void formation, etc. Implementations of the invention may be used to form line-first dual damascene structures.

As used herein, the term via refers generally to an electrically conductive feature running substantially perpendicular to the upper surface of the semiconductor substrate. Also, the terms line, interconnect, and wire are used interchangeably, and refer generally to an electrically conductive feature running substantially parallel to the upper surface of the semiconductor substrate. Furthermore, as used herein, the term conductive refers to electrical conductivity, unless otherwise noted.

Figure 1:
FIGS. 1-11 show processing steps and structures in accordance with aspects of the invention.

FIGS. 1-11 show processing steps and respective structures in accordance with aspects of the invention. Specifically, FIG. 1 shows a lower interconnect level 100 comprising a dielectric layer 101 and at least one conductive feature 102 formed in the dielectric layer 101. In embodiments, the at least one conductive feature 102 comprises at least one via; however, the invention is not limited to vias in the lower interconnect level 100, and any desired conductive feature(s), e.g., vias, lines, etc., may be embedded in the dielectric layer 101.

As depicted in FIG. 1, the lower interconnect level 100 may be formed directly or indirectly on a surface of a substrate 105, e.g., an integrated circuit (IC) substrate. The substrate 105 may include a semiconducting material, an insulating material, a conductive material or any combination thereof. When the substrate 105 is comprised of a semiconducting material, any semiconductor such as, for example, Si, SiGe, SiGeC, SiC, Ge alloys, GaAs, InAs, InP and other MN or compound semiconductors can be used. In addition to these listed types of semiconducting materials, the present invention also contemplates cases in which the semiconductor substrate is a bulk substrate and also cases in which the semiconductor substrate is a layered semiconductor such as, for example, Si/SiGe, Si/SiC, silicon-on-insulators (SOIs) or silicon germanium-on-insulators (SGOIs).

When the substrate 105 is an insulating material, the insulating material can be an organic insulator, an inorganic insulator or a combination thereof including multilayers. When the substrate 105 is a conducting material, the substrate may include, for example, polySi, an elemental metal, alloys of elemental metals, a metal silicide, a metal nitride or combinations thereof including multilayers. When the substrate 105 comprises a semiconducting material, one or more semiconductor devices such as, for example, complementary metal oxide semiconductor (CMOS) devices can be fabricated thereon.

The dielectric layer 101 may include any interlevel or intralevel interconnect dielectric material including inorganic dielectrics or organic dielectrics. The dielectric material may be porous or non-porous. Some examples of suitable dielectrics that can be used as the dielectric layer 101 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material of the dielectric layer 101 typically has a dielectric constant that is about 4.0 or less, with a dielectric constant of about 2.8 or less being more typical. These dielectrics generally have a lower parasitic cross talk as compared with dielectric materials that have a higher dielectric constant than 4.0. The thickness of the dielectric layer 101 may vary depending upon the dielectric material used as well as the exact number of dielectrics within the lower interconnect level 100. Typically, and for normal interconnect structures, the dielectric layer 101 has a thickness from 200 nm to 450 nm, although the invention is not limited to these dimensions and any suitable thickness are also contemplated by the present invention.

Figure 2:
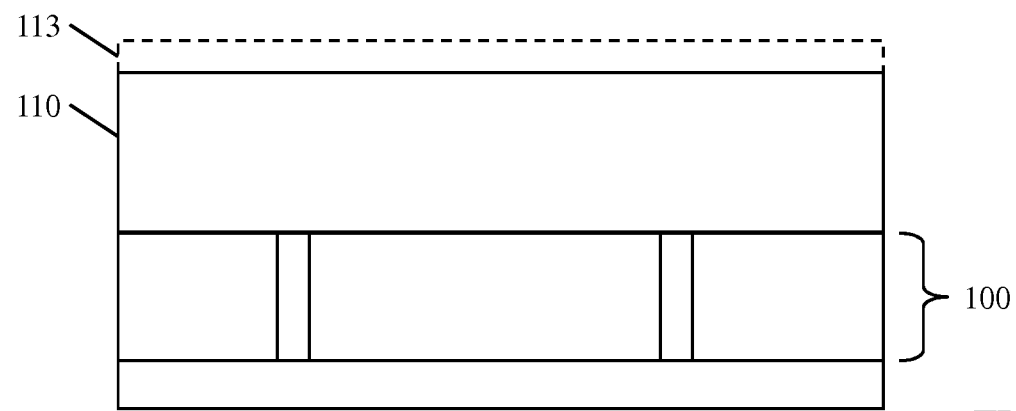

FIG. 2 shows the formation of a sacrificial conductive mandrel layer 110 on the lower interconnect level 100 in accordance with aspects of the invention. The sacrificial conductive mandrel layer 110 may be composed of any suitable conductive material that can be used in an electroplating process, as described in greater detail herein. In particular exemplary embodiments, the sacrificial conductive mandrel layer 110 is composed of Al or W/Ta/Ti; although other conductive materials are also contemplated by the present invention. The sacrificial conductive mandrel layer 110 may be formed using any suitable semiconductor manufacturing process, such as chemical vapor deposition (CVD), plasma enhanced chemical vapor deposition (PECVD), sputtering, etc. The sacrificial conductive mandrel layer 110 may be formed with any desired thickness, e.g., vertical height perpendicular to the upper surface of the lower interconnect level 100, depending on the size, shape, number, and layout of interconnects to be formed in the integrated circuit.

As additionally depicted in FIG. 2, an optional insulating cap 113 (shown in dashed lines) may be formed on top of the sacrificial conductive mandrel layer 110. The insulating cap 113 may be composed of one or more layers of any suitable electrically insulating material, such as oxide (e.g., $SiO_2$), nitride, and combinations thereof. The insulating cap 113 may be formed using conventional semiconductor fabrication techniques, such as chemical vapor deposition (CVD), plasma enhanced chemical vapor deposition (PECVD), atomic layer deposition (ALD), and physical vapor deposition (PVD). As described in greater detail herein, the insulating cap 113 may be used for preventing the formation of plated conductive material on top of the sacrificial conductive mandrel layer 110, and as a stop in a polishing and/or planarizing step.

Figure 3:
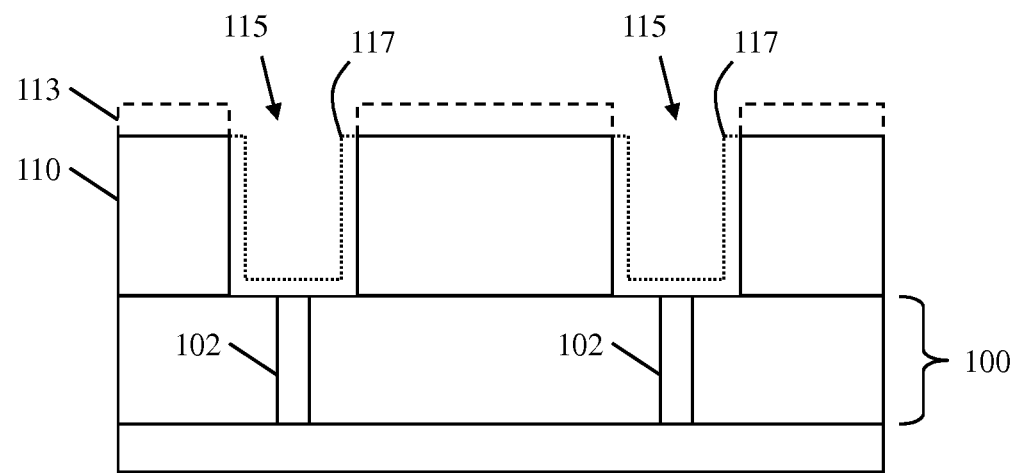

FIG. 3 shows the formation of trenches 115 in the sacrificial conductive mandrel layer 110 in accordance with aspects of the invention. In embodiments, the trenches 115 are used to define at least one interconnect or other conductive features that are later formed in electrical contact with the at least one conductive feature 102. To this end, in embodiments, the trenches 115 at least overlap, and preferably are substantially aligned with, the at least one conductive feature 102. The trenches 115 extend through the entirety of the sacrificial conductive mandrel layer 110 to expose portions of the lower interconnect level 100.

The trenches 115 may be formed using conventional material-removal techniques, such as, for example, reactive ion etching or laser ablation, and patterns are defined employing conventional lithographic processes, By way of illustration, a lithographic masking and etching process may include, e.g., forming a photoresist material to the top surface of the sacrificial conductive mandrel layer 110, exposing the photoresist using a desired pattern of radiation, developing the exposed resist using a resist developer, etching (dry etching such as reactive ion etch (RIE) or wet etching) an opening in the sacrificial conductive mandrel layer 110 through the mask defined by the photoresist, and stripping the resist. In implementations using the optional insulating cap 113, the trenches 115 are similarly formed through the insulating cap 113.

As additionally depicted in FIG. 3, an optional seed layer 117 (shown in dotted lines) may be formed over the exposed surfaces of the trenches 115. The optional seed layer 117 may be formed using conventional materials such as, for example, Cu, CuAl, CuIr, CuTa, CuRh, or other alloys of Cu, i.e., Cu-containing alloys. The optional seed layer 117 may be formed using conventional techniques such as, for example, chemical vapor deposition (CVD), plasma enhanced chemical vapor deposition (PECVD), atomic layer deposition (ALD), and physical vapor deposition (PVD). Depending on the process used in forming the seed layer 117, the seed layer 117 may additionally be formed on the top surfaces of the structure (not shown).

Figure 4:
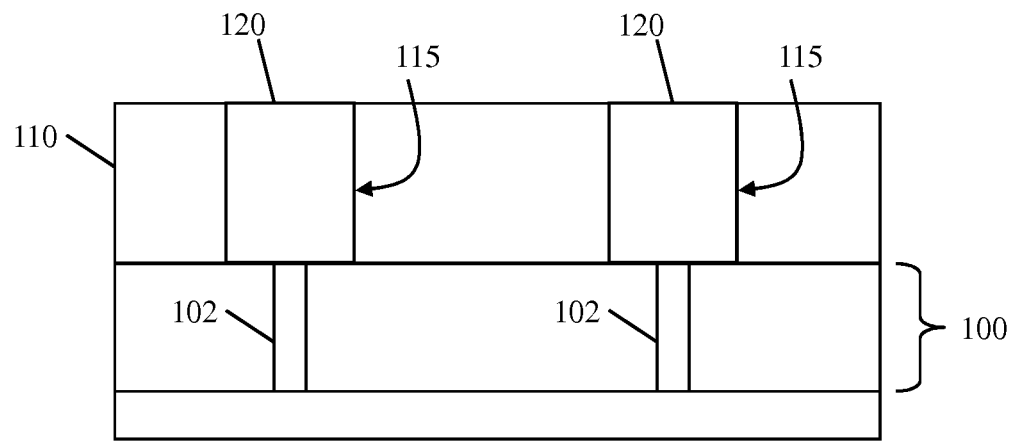

FIG. 4 shows the formation of conductive material 120 in the trenches 115 in accordance with aspects of the invention. The conductive material 120 may be any desired conductive material suitable for forming interconnects, lines, wires, etc. For example, the conductive material 120 may be composed of a metal-containing conductive material such as, for example, Cu, W or Al, with Cu or a Cu alloy (such as AlCu). In a particular exemplary embodiment, the conductive material 120 is composed of Cu or Au when the sacrificial conductive mandrel layer 110 is composed of Al. In another exemplary embodiment, the conductive material 120 is composed of Cu when the sacrificial conductive mandrel layer 110 is composed of W/Ta/Ti.

In embodiments, the conductive material 120 is formed using an electroplating process using the sacrificial conductive mandrel layer 110 as at least one of a seed material and an anode, e.g., electrical contact for the electroplating. According to aspects of the invention, there is no need for an additional seed layer (e.g., seed layer 117) since the sacrificial conductive mandrel layer 110 acts as the seed material for the plating process. In this manner, the process may include forming a conductive feature directly on the sacrificial conductive mandrel layer 110 which is devoid of an intermediate seed layer. As such, implementations of the invention advantageously eliminate the extra manufacturing and/or processing steps associated with an additional, discrete seed layer. Moreover, implementations of the invention also avoid problems associated with poor seed layer coverage, seed layer pinch-off of high AR trenches, seed layer-induced void formation, etc.

In implementations when the optional seed layer 117 is employed, the sacrificial conductive mandrel layer 110 may still be used as an anode in the plating process to provide more reliable cross wafer conduction. The seed layer 117 may be used to adjust the plating process by affecting the fill from the bottoms and sides of the trenches.

Still referring to FIG. 4, the top surface of the structure may be planarized following formation of the conductive material 120. For example, a chemical mechanical polish (CMP) or any other suitable planarization technique may be used to remove any overburden, e.g., conductive material 120 that has formed on top of the sacrificial conductive mandrel layer 110. In implementations using the optional insulating cap 113, overburden will not form on the insulating cap 113 but may extend upward out of trenches above the top surface of the insulating cap 113. Accordingly, a CMP may be used to remove the overburden to a level planar with the insulating cap 113, and one or more subsequent RIE planarization processes may be used to selectively remove the insulating cap 113 and any remaining overburden.

Figure 5:
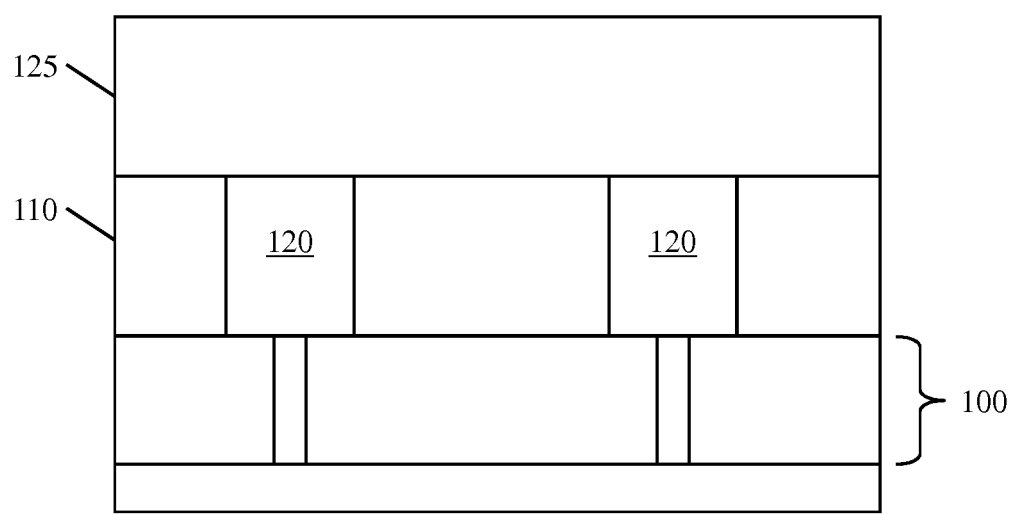

FIG. 5 shows the formation of a second sacrificial mandrel layer 125 on the sacrificial conductive mandrel layer 110 in accordance with aspects of the invention. The second sacrificial mandrel layer 125 may be formed in the same manner and using the same materials as the sacrificial conductive mandrel layer 110. Alternatively, the second sacrificial mandrel layer 125 may be composed of a different material than the sacrificial conductive mandrel layer 110. For example, the second sacrificial mandrel layer 125 may be composed of a different conductive material than the sacrificial conductive mandrel layer 110, or may alternatively be composed of an insulator material. In line-first dual damascene implementations of the invention, the sacrificial conductive mandrel layer 110 is used to define one or more lines (e.g., interconnects, wires, etc.) and the second sacrificial conductive mandrel layer 125 is used to define one or more vias contacting the one or more lines. An insulating cap (not shown) may optionally be formed on top of the second sacrificial mandrel layer 125, e.g., similar to insulating cap 113.

Figure 6:
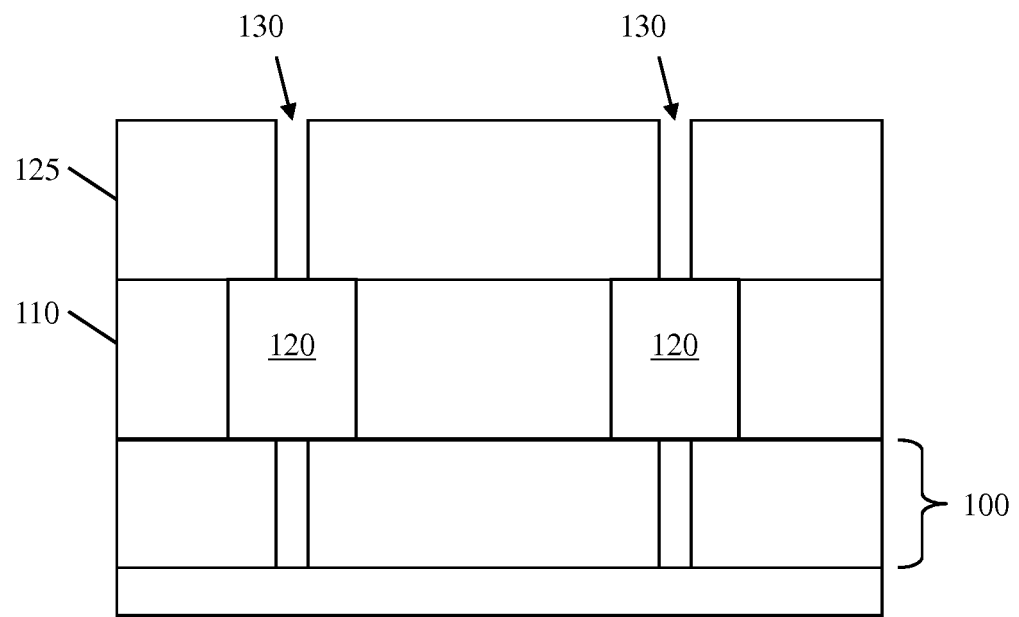

FIG. 6 shows the formation of holes 130 in the second sacrificial mandrel layer 125 in accordance with aspects of the invention. In embodiments, the holes 130 are via holes intended to overlap, and preferably substantially align with, the conductive material 120 formed in the sacrificial conductive mandrel layer 110. The holes 130 may be formed using conventional material removal techniques such as, for example, conventional lithographic processes, e.g., masking and etching. In implementations when the second sacrificial mandrel layer 125 is composed of the same material as the sacrificial conductive mandrel layer 110, a timed RIE may be used to avoid etching too deeply into the sacrificial conductive mandrel layer 110 in the event of unlanded holes, e.g., holes 130 that do not overlap the conductive material 120. On the other hand, in implementations when the second sacrificial mandrel layer 125 is composed of a different material than the sacrificial conductive mandrel layer 110, a selective RIE may be used to stop the etch on the sacrificial conductive mandrel layer 110 and the conductive material 120. A seed layer may optionally be formed in the holes 130, e.g., similar to seed layer 117.

Figure 7:
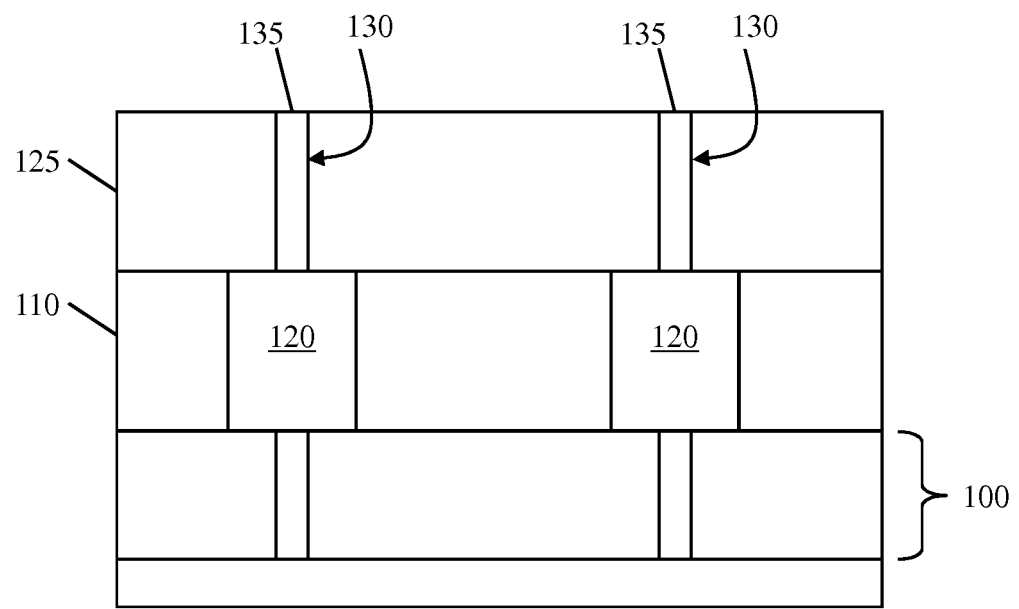

FIG. 7 shows the formation of conductive material 135 in the holes 130 in accordance with aspects of the invention. In implementations when the second sacrificial mandrel layer 125 is composed of the same material as the sacrificial conductive mandrel layer 110, the conductive material 135 may be formed using similar materials and techniques as used in the formation of conductive material 120. For example, when the second sacrificial mandrel layer 125 is composed of a conductor, the conductive material 135 may be formed using an electroplating process in which the second sacrificial mandrel layer 125 acts as a seed material, thereby eliminating the need for an additional seed layer for plating the conductive material 135. On the other hand, in implementations when the second sacrificial mandrel layer 125 is composed of a different material than the sacrificial conductive mandrel layer 110, another process may be used to form the conductive material 135, such as CVD, PECVD, etc.

Still referring to FIG. 7, the top surface of the structure may be planarized following formation of the conductive material 135. For example, a chemical mechanical polish (CMP) or any other suitable planarization technique may be used to remove any overburden, e.g., conductive material 135, that has formed on top of the second sacrificial mandrel layer 125.

Figure 8:
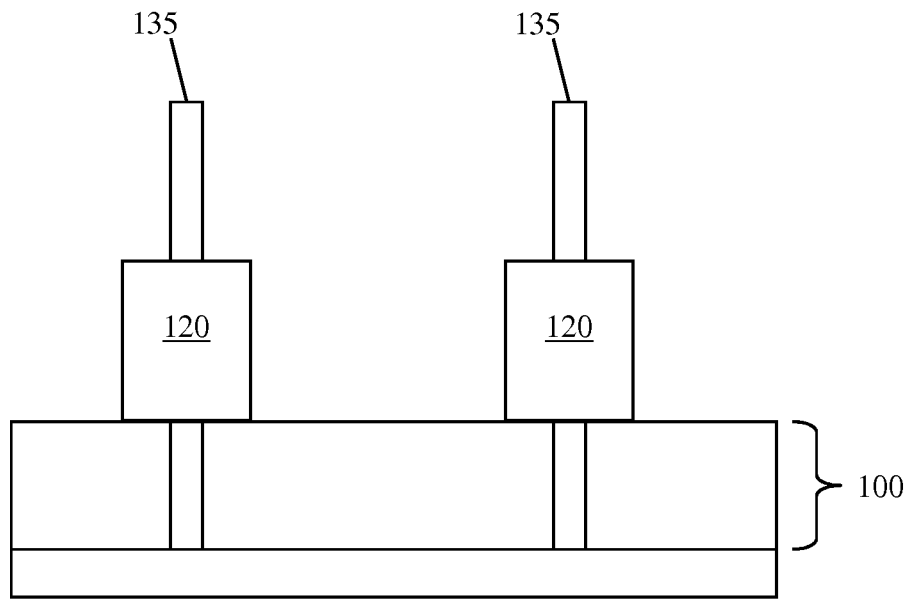

FIG. 8 shows the removal of the second sacrificial mandrel layer 125 and the sacrificial conductive mandrel layer 110 to expose the conductive material 120 and conductive material 135 in accordance with aspects of the invention. In embodiments, the second sacrificial mandrel layer 125 and the sacrificial conductive mandrel layer 110 are stripped using a wet or dry etch that selectively removes the material of the mandrel layers 110 and 125, while avoiding removing the conductive materials 120 and 135 and the materials comprised in the lower interconnect level 100.

Any suitable etch process parameters may be utilized to achieve a desired selectivity based on the materials used in the mandrel layers 110 and 125, the conductive materials 120 and 135, and the materials comprised in the lower interconnect level 100. In a particular exemplary embodiment, the mandrel layers 110 and 125 are composed of W/Ta/Ti, the conductive materials 120 and 135 are composed of Cu, and the etch process for stripping the mandrel layers 110 and 125 comprises a dry etch using $XeF_2$. In another exemplary embodiment, the mandrel layers 110 and 125 are composed of Al, the conductive materials 120 and 135 are composed of Au, and the etch process for stripping the mandrel layers 110 and 125 comprises a dry etch using HCl. In an even further exemplary embodiment, the mandrel layers 110 and 125 are composed of Al, the conductive materials 120 and 135 are composed of Cu, and the etch process for stripping the mandrel layers 110 and 125 comprises a wet etch using $H_3PO_4$ (phosphoric acid).

Figure 9:
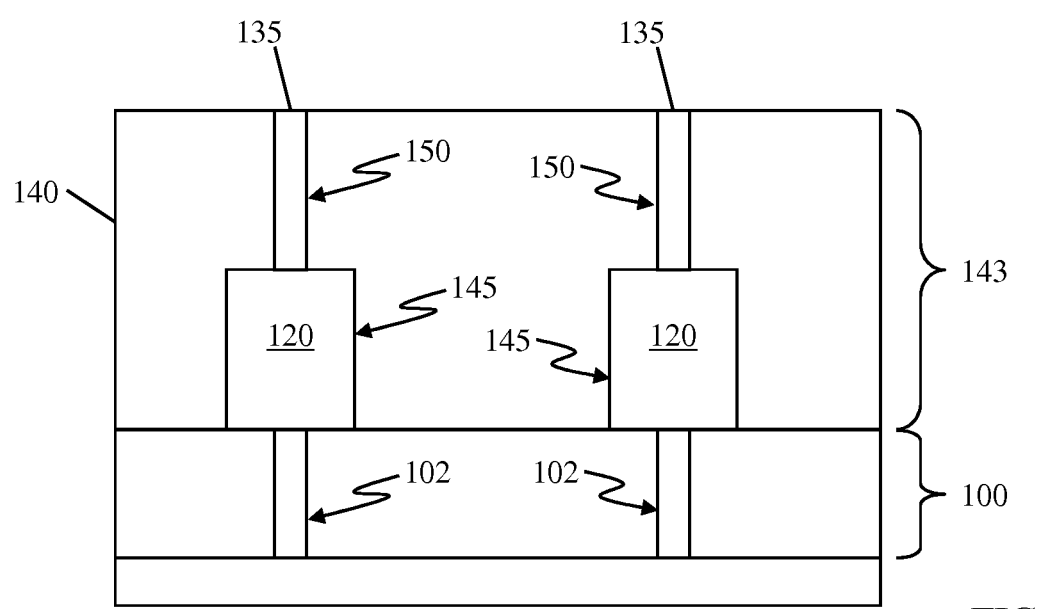

FIG. 9 shows the formation of dielectric material 140 (e.g., electrical insulating layer) on top of the lower interconnect level 100 and around the conductive materials 120 and 135. The dielectric material 140 may comprise any suitable dielectric material such as those described above with respect to dielectric material 101. The dielectric material 140 may be formed using conventional semiconductor processing techniques such as, for example, CVD, PECVD, etc. The top surface of the structure may be planarized, e.g., using CMP, to expose the tops of the conductive material 135.

As depicted in FIG. 9, formation of the dielectric material 140 completes an upper interconnect level 143 on top of the upper interconnect level 100. The upper interconnect level 143 comprises wires 145 (e.g., defined by conductive material 120) and vias 150 (e.g., defined by conductive material 135) that provide electrical pathways to conductive feature 102. The steps described in FIGS. 2-9 may be repeated as many times as desired to form additional interconnect levels of the integrated circuit.

Figure 10:
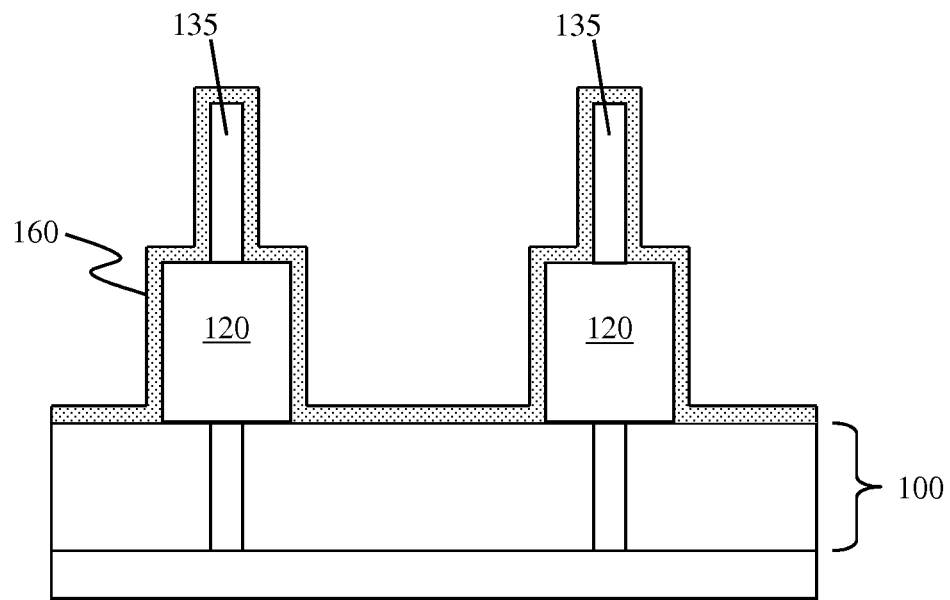
Figure 11:
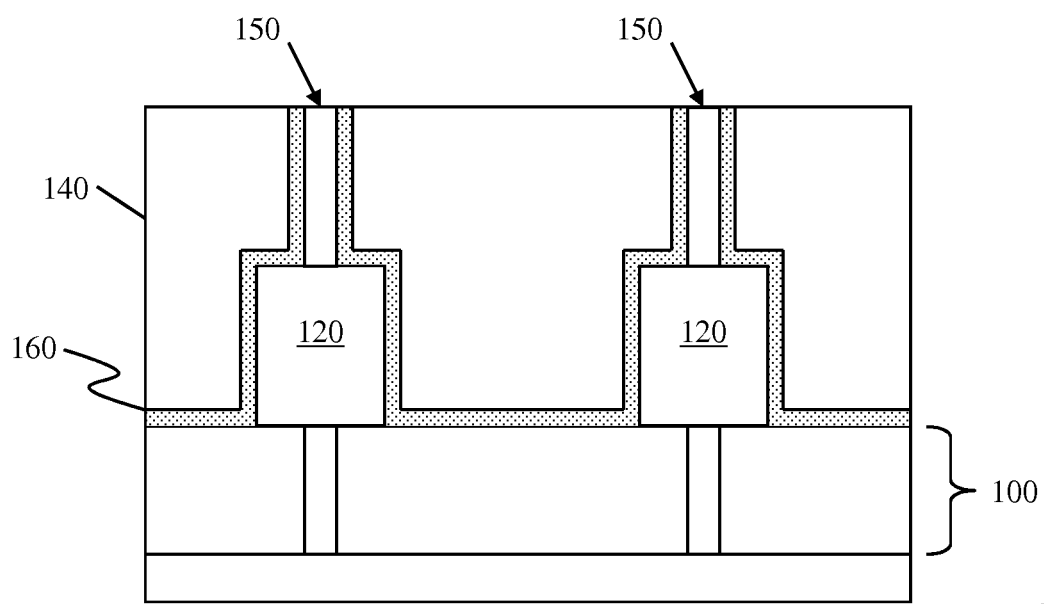

FIGS. 10 and 11 show the formation of an optional barrier layer 160 in accordance with aspects of the invention. As depicted in FIG. 10, starting from the structure shown in FIG. 8, a barrier layer 160 may be formed on the exposed conductive materials 120 and 135 and exposed portions of layer 100. The barrier layer 160, which may comprise silicon nitride or any other insulating material that can serve as a barrier to prevent conductive material from diffusing therethrough can be formed by a deposition process such as, for example, atomic layer deposition (ALD), chemical vapor deposition (CVD), plasma enhanced chemical vapor deposition (PECVD), physical vapor deposition (PVD), sputtering, or chemical solution deposition.

As depicted in FIG. 11, the dielectric material 140 may be formed on the barrier layer 160, e.g., in the same manner as described above with respect to FIG. 9. A planarization process, e.g., CMP, may be used to planarize the dielectric material 140 and simultaneously remove a top portion of the barrier layer 160 to expose the tops of the vias 150. Alternatively, a planarization process, e.g., CMP, may be used to planarize the dielectric material 140 down to the barrier layer 160, and a subsequent selective RIE may be used to remove the top portion of the barrier layer 160 to expose the tops of the vias 150.

The steps described in FIGS. 2-9 may be used in a dual damascene process. The invention is not limited to use with dual damascene processes, however, and aspects of the invention may be used, for example, in a single damascene implementation. For example, using the structure shown in FIG. 4 as a starting point, the process may comprise stripping the sacrificial mandrel layer 110 and forming the dielectric material 140 (and optionally the barrier layer 160) around the first conductive material 120, without forming the second sacrificial mandrel layer 125 and second conductive material 135.

Figure 12:
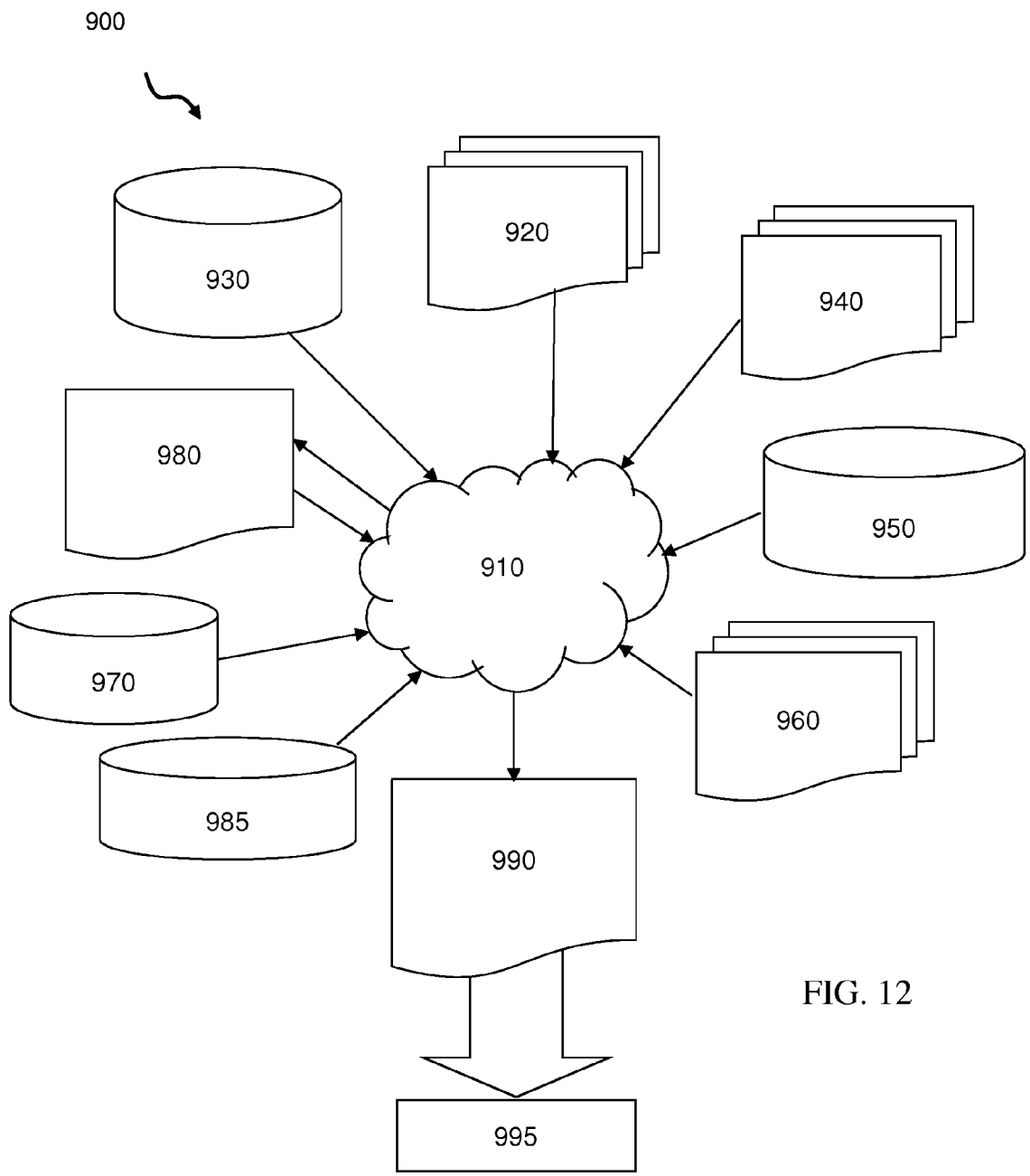
FIG. 12 is a flow diagram of a design process used in semiconductor design, manufacture, and/or test.

FIG. 12 is a flow diagram of a design process used in semiconductor design, manufacture, and/or test. FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 990 may comprise a compiled, executable HDL simulation model that functionally simulates the devices shown in FIGS. 1-11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method implemented in a computer-aided design system for generating a functional design model of an interconnect structure, the computer-aided design system comprising a computer device, said method comprising:
generating, by the computer device, a functional representation of a sacrificial conductive material layer;
generating, by the computer device, a functional representation of a trench in the sacrificial conductive material layer;
generating, by the computer device, a functional representation of a conductive feature in the trench, wherein the conductive feature is over and contacting a lower conductive feature in a dielectric layer; and
generating, by the computer device, a functional representation of an insulating layer around the conductive feature to embed the conductive feature in the insulating layer,
wherein the method further comprises manufacturing the interconnect structure.

2. The method of claim 1, further comprising:
generating, by the computer device, a functional representation of a second sacrificial conductive material layer on the sacrificial conductive material layer and the conductive feature;
generating, by the computer device, a functional representation of a second trench in the second sacrificial conductive material layer; and
generating, by the computer device, a functional representation of a second conductive feature in the second trench and contacting the conductive feature.

3. The method of claim 1, wherein the conductive feature is directly on the sacrificial conductive material layer which is devoid of an intermediate seed layer.

4. The method of claim 1, wherein one of:
the sacrificial conductive material layer comprises W/Ta/Ti, and the conductive feature comprises Cu;
the sacrificial conductive material layer comprises Al, and the conductive feature comprises Au; and
the sacrificial conductive material layer comprises Al, and the conductive feature comprises Cu.

5. The method of claim 1, further comprising:
generating, by the computer device, a functional representation of an insulating cap on the sacrificial conductive material layer; and
generating, by the computer device, a functional representation of the trench through the insulating cap.

6. The method of claim 1, further comprising:
generating, by the computer device, a functional representation of a diffusion barrier layer on exposed surfaces of the conductive feature; and
generating, by the computer device, a functional representation of the insulating layer on the diffusion barrier layer.

7. The method of claim 6, wherein the diffusion barrier layer is on the dielectric layer.

8. The method of claim 1, wherein the computer device comprises program code stored in a non-transitory computer readable medium.

9. The method of claim 1, wherein the lower conductive feature comprises a via or wire embedded in the dielectric layer.

10. The method of claim 1, wherein the insulating layer is on the dielectric layer.

11. A method implemented in a computer-aided design system for generating a functional design model of an interconnect structure, said method comprising:
generating, by a computer device of the computer-aided design system, a functional representation of a first conductive material layer on one of a lower interconnect level and a substrate;
generating, by the computer device, a functional representation of first trenches in the first conductive material layer;
generating, by the computer device, a functional representation of a first conductor filling the first trenches to form first conductive features, wherein the first conductive features are over and contacting respective lower conductive features in a dielectric layer;
generating, by the computer device, a functional representation of a second conductive material layer on the first conductive material layer;
generating, by the computer device, a functional representation of second trenches in the second conductive material layer;
generating, by the computer device, a functional representation of a second conductor filling the second trenches to form second conductive features;
generating, by the computer device, a functional representation of an insulating layer around the first and second conductive features such that the first and second conductive features are embedded in the insulating layer,
wherein the method further comprises manufacturing the interconnect structure.

12. The method of claim 11, wherein:
the first conductive features comprise one of lines, wires, and interconnects; and
the second conductive features comprise vias.

13. The method of claim 11, further comprising:
generating, by the computer device, a functional representation of an insulating cap on the first conductive material layer; and
generating, by the computer device, a functional representation of the first trenches through the insulating cap.

14. The method of claim 11, wherein the computer device comprises program code stored in a non-transitory computer readable medium.

15. The method of claim 11, wherein the insulating layer is on the dielectric layer.

16. The method of claim 11, further comprising generating, by the computer device, a functional representation of a diffusion barrier layer on the first conductive features and the dielectric layer, wherein the insulating layer is on the diffusion barrier layer.

17. A method implemented in a computer-aided design system for generating a functional design model of an interconnect structure, said method comprising:
generating a functional representation of an electroplated conductive feature embedded in an insulating layer, wherein the structure is devoid of a seed layer between the electroplated conductive feature and the insulating layer, the electroplated conductive feature comprises one of a via and a wire, and the insulating layer comprises an interconnect level, wherein the electroplated conductive feature is over and contacting a lower conductive feature in a dielectric layer,
wherein the generating is performed by a computer device of the computer-aided design system; and
wherein the method further comprises manufacturing the interconnect structure.

18. The method of claim 17, wherein the computer device comprises program code stored in a non-transitory computer readable medium.

19. The method of claim 17, wherein the insulating layer is on the dielectric layer.

20. The method of claim 17, further comprising generating, by the computer device, a functional representation of a diffusion barrier layer on the electroplated conductive feature and the dielectric layer, wherein the insulating layer is on the diffusion barrier layer.

* * * * *